United States Patent
Cheng

(10) Patent No.: US 10,832,950 B2
(45) Date of Patent: Nov. 10, 2020

(54) INTERCONNECT WITH HIGH QUALITY ULTRA-LOW-K DIELECTRIC

(71) Applicant: INTERNATIONAL BUSINESS MACHINES CORPORATION, Armonk, NY (US)

(72) Inventor: Kangguo Cheng, Schenectady, NY (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 16/270,083

(22) Filed: Feb. 7, 2019

(65) Prior Publication Data

US 2020/0258776 A1 Aug. 13, 2020

(51) Int. Cl.
| | |
|---|---|
| H01L 21/76 | (2006.01) |
| H01L 21/768 | (2006.01) |
| H01L 21/311 | (2006.01) |
| H01L 23/522 | (2006.01) |
| H01L 23/532 | (2006.01) |

(52) U.S. Cl.
CPC .. *H01L 21/76831* (2013.01); *H01L 21/31116* (2013.01); *H01L 21/31144* (2013.01); *H01L 21/7682* (2013.01); *H01L 21/76802* (2013.01); *H01L 21/76877* (2013.01); *H01L 23/5226* (2013.01); *H01L 23/5329* (2013.01); *H01L 2221/1063* (2013.01)

(58) Field of Classification Search
CPC ......... H01L 21/76831; H01L 21/31116; H01L 21/31144; H01L 21/76802; H01L 21/7682; H01L 21/76877; H01L 23/5226; H01L 23/5329

USPC ........................................................ 257/758
See application file for complete search history.

(56) References Cited

U.S. PATENT DOCUMENTS

| | | | |
|---|---|---|---|
| 6,156,651 A | 12/2000 | Havemann | |
| 7,045,453 B2 | 5/2006 | Canaperi et al. | |
| 7,179,758 B2 | 2/2007 | Chakrapani et al. | |
| 7,750,479 B2 | 7/2010 | Purushothaman et al. | |
| 7,781,332 B2 | 8/2010 | Arnold et al. | |
| 8,481,423 B2 | 7/2013 | Arnold et al. | |
| 8,492,170 B2 | 7/2013 | Xie et al. | |
| 8,592,327 B2 | 11/2013 | Ranjan et al. | |
| 8,859,430 B2 | 10/2014 | Chiba | |
| 9,059,263 B2 | 6/2015 | Ramachandran et al. | |
| 9,064,948 B2 | 6/2015 | Cai et al. | |
| 2002/0005584 A1* | 1/2002 | Domae | H01L 23/5222 257/758 |
| 2004/0063305 A1* | 4/2004 | Kloster | H01L 21/7682 438/619 |

(Continued)

*Primary Examiner* — Sheikh Maruf
(74) *Attorney, Agent, or Firm* — Tutunjian & Bitetto, P.C.; L. Jeffrey Kelly

(57) ABSTRACT

Semiconductor devices and methods for forming the semiconductor devices include first line trenches formed in a dielectric layer on a substrate. Sacrificial spacers are formed on sidewalls of the dielectric layer in the first line trenches. Second line trenches are formed in the dielectric layer, the first line trenches and the second line trenches including alternating rows of trenches separated by the sacrificial spacers. The first line trenches and the second line trenches are filled with conductive material to form conductive lines. The sacrificial spacers are replaced with an isolation material.

16 Claims, 13 Drawing Sheets

(56) References Cited

U.S. PATENT DOCUMENTS

| | | | |
|---|---|---|---|
| 2004/0072430 A1* | 4/2004 | Huang | H01L 21/31144 438/689 |
| 2004/0219780 A1* | 11/2004 | Ohuchi | H01L 21/31144 438/637 |
| 2005/0017364 A1* | 1/2005 | Iba | H01L 21/76804 257/758 |
| 2005/0133920 A1* | 6/2005 | Liou | H01L 21/76831 257/758 |
| 2005/0133923 A1* | 6/2005 | Yoshie | H01L 21/02337 257/758 |
| 2005/0153535 A1* | 7/2005 | Hwang | H01L 21/31116 438/622 |
| 2006/0115981 A1 | 6/2006 | Shieh et al. | |
| 2006/0131754 A1* | 6/2006 | Ohtake | H01L 21/76816 257/760 |
| 2006/0216924 A1 | 9/2006 | Wu et al. | |
| 2010/0244255 A1* | 9/2010 | Lee | H01L 21/7682 257/751 |
| 2010/0267231 A1 | 10/2010 | van Schravendijk et al. | |
| 2011/0183516 A1* | 7/2011 | Lee | H01L 21/7682 438/653 |

* cited by examiner

INTERCONNECT WITH HIGH QUALITY ULTRA-LOW-K DIELECTRIC

BACKGROUND

The present invention generally relates to interconnects in semiconductor devices, and more particularly to an interconnect with a high quality ultra-low-k dielectric.

As semiconductors decrease in size, back end of line (BEOL) structures also get smaller. Reducing metal line width can result in greater resistance. Yet, for a given node size of a semiconductor, increasing metal line width can result in decreased isolation width between metal structures. Decreasing the width of a dielectric fill between metal lines can increase the risk of dielectric breakdown, causing reliability issues. Inaccuracies and damage resulting from etching processes in the formation of trenches for the metal lines can be unpredictable and, thus, less precise.

SUMMARY

In accordance with an embodiment of the present invention, a method for forming a semiconductor device is presented. The method includes forming first line trenches in a dielectric layer on a substrate. Sacrificial spacers are formed on sidewalls of the dielectric layer in the first line trenches. Second line trenches are formed in the dielectric layer, the first line trenches and the second line trenches including alternating rows of trenches separated by the sacrificial spacers. The first line trenches and the second line trenches are filled with conductive material to form conductive lines. The sacrificial spacers are replaced with an isolation material.

In accordance with another embodiment of the present invention, a method for forming a semiconductor device is presented. The method includes patterning a first etch mask over a dielectric layer on a substrate corresponding to a first pattern. First line trenches are etched into the dielectric layer through the first etch mask. The first etch mask is removed. Sacrificial spacers are formed on sidewalls of the dielectric layer in the first line trenches. A second etch mask is patterned over the dielectric layer and the first line trenches corresponding to second pattern, the first pattern and the second pattern corresponding to alternating rows of first conductive lines and second conductive lines. Second line trenches are etched into the dielectric layer through the second etch mask. The first line trenches and the second line trenches are filled with a conductive material to form the first conductive lines and the second conductive lines. The sacrificial spacers are replaced with an isolation material.

In accordance with another embodiment of the present invention, a semiconductor device is presented. The device includes first conductive lines and second conductive lines disposed within a dielectric layer on a substrate, the first conductive lines and the second conductive lines being alternating rows of conductive lines separated by isolation regions formed by replacing sacrificial spacers with an isolation material. A device layer is disposed on a side of the substrate opposite to the dielectric layer, the device layer including one or more device structures. Vias in the substrate connect each of the one or more device structures with a corresponding one of the first conductive lines and the second conductive lines.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Figure 1:
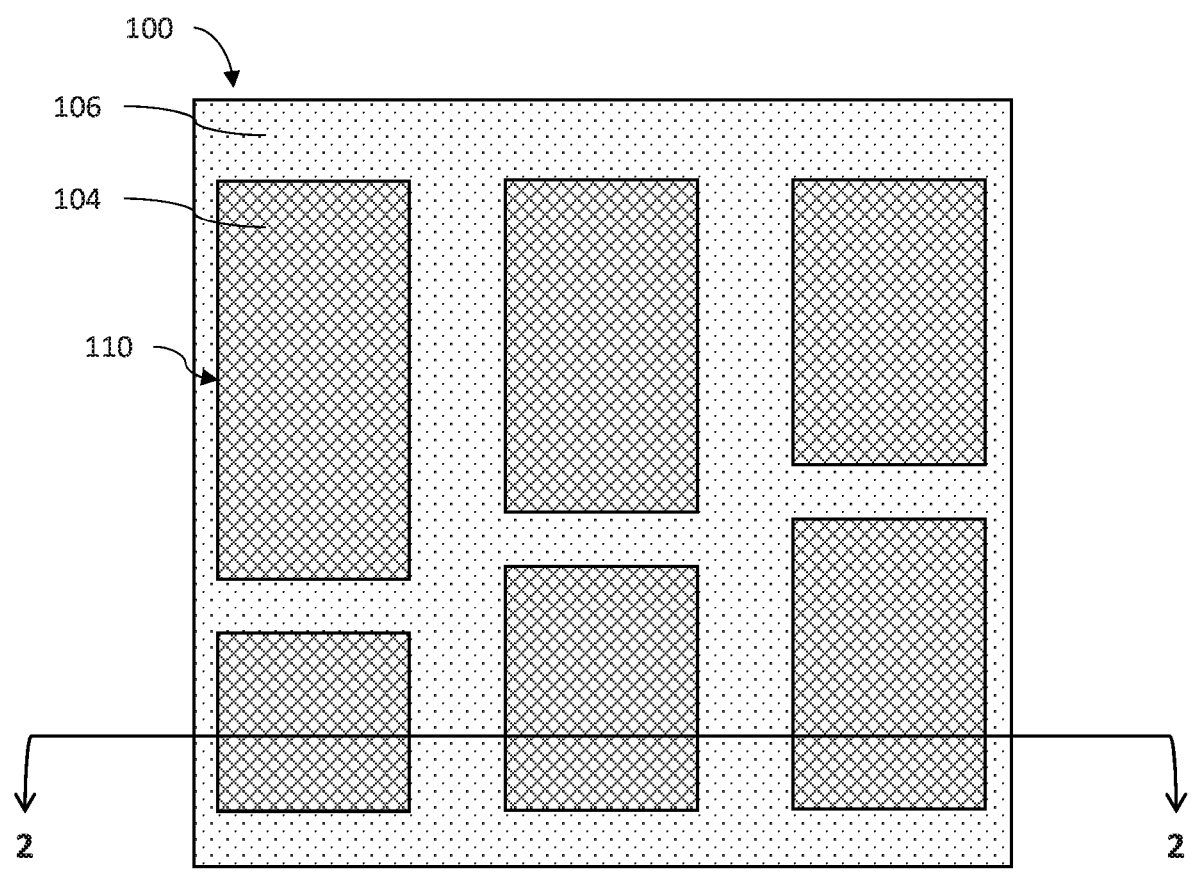
FIG. 1 is a top view showing a semiconductor device with a patterned etch mask over a dielectric layer on a substrate, in accordance with an embodiment of the present invention.

According to aspects of the present invention, an embodiment can include a semiconductor device having back-end-of-line (BEOL) interconnects with high quality ultra-low-k dielectric.

When etching a pattern into an ultra-low-k dielectric, the etchant can damage the sidewalls of the dielectric, thus causing non-uniformities in the dielectric sidewalls along the etched openings. These non-uniformities can cause performance variations. For example, for small minimum metal pitch sizes corresponding to metal lines to be formed in the etched openings, the non-uniformities can increase the likelihood of reliability issues, such as, e.g., dielectric breakdown due to thin dielectric between metal lines. Thus, a sacrificial spacer is deposited along the sidewalls of the dielectric after etching.

According to aspects of the present invention, after etching a first set of openings into the dielectric and depositing the sacrificial spacers, an etch mask is removed and redeposited. The new etch mask is patterned for a second set of metal lines. Openings are then etched into the dielectric through the etch mask.

The etch mask can then be removed and both the first and second sets of openings exposed. Each of the first and second sets of openings are filled with a conductive material, such as, e.g., a metal, as a wiring layer. The sacrificial spacers are removed from between the conductive material, and the resulting cavities refilled with a new dielectric material, including, e.g., an ultra-low-k dielectric. As a result, the wiring is separated by a high quality dielectric because the formation and replacement of the spacers facilitates regular and precise widths and damage-free sidewalls, resulting in better reliability.

Exemplary applications/uses to which the present invention can be applied include, but are not limited to: conductive layer processing for semiconductor devices including, e.g., processing devices, memory devices, sensors, and other semiconductor devices.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Referring now to the drawings in which like numerals represent the same or similar elements and initially to FIG. 1, a top view showing a semiconductor device with a patterned etch mask over a dielectric layer on a substrate is depicted according to an embodiment of the present invention.

According to an embodiment of the present invention, a first line mask 106 is patterned on a dielectric layer 104 over a substrate 102 of a semiconductor device 100. The first line mask 106 is, e.g., an etch mask patterned for a first set of conductive lines for interconnects in a back-end-of-line (BEOL) device.

The device 100 includes a substrate 102 having multiple layers formed thereon. The substrate 102 can include any suitable substrate structure, e.g., a bulk semiconductor, a semiconductor-on-insulator (SOI) substrate, etc. In one example, the substrate 102 can include a silicon-containing material. Illustrative examples of Si-containing materials suitable for the substrate 102 can include, but are not limited to, Si, SiGe, SiGeC, SiC and multi-layers thereof. Although silicon is the predominantly used semiconductor material in wafer fabrication, alternative semiconductor materials can be employed as additional layers, such as, but not limited to, germanium, gallium arsenide, gallium nitride, silicon germanium, cadmium telluride, zinc selenide, etc. Moreover, the substrate 102 can include prebuilt devices, including, e.g., transistors, contacts, isolations, and other device structures.

Forming the dielectric layer 104 can include, e.g., a layer of dielectric material blanket deposited atop the entire substrate 102 and planarized. The blanket dielectric may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides; other carbon-containing materials; organo-inorganic materials such as spin-on glasses and silsesquioxane-based materials; and diamond-like carbon (DLC, also known as amorphous hydrogenated carbon, a-C:H). Additional choices for the blanket dielectric include: any of the aforementioned materials in porous form, or in a form that changes during processing to or from being porous and/or permeable to being non-porous and/or non-permeable.

In particular, the dielectric layer 104 can include, e.g., an ultra-low-k (ULK) dielectric material. A ULK dielectric material can include, e.g., a dielectric constant ranging from about 1.5 to about 3.5, or between about 2.0 and about 2.5. In one embodiment, the ULK dielectric layer is non-porous. In another embodiment, the ULK dielectric layer is porous.

In one embodiment, the dielectric layer 104 includes SiCOH or an aromatic hydrocarbon polymer composition. In another embodiment, the dielectric layer 104 includes carbon-doped oxides. In an even further embodiment, the ULK dielectric layer includes an undoped silica glass.

The blanket dielectric may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The first line mask 106 is deposited across the dielectric layer 104. The first line mask 106 can include, e.g., a softmask or a hardmask material, including, e.g., silicon dioxide (SiO$_2$) or silicon nitride (SiN), titanium nitride (TiN), among other oxides and nitrides. The first line mask 106 is deposited across a surface of the dielectric layer 104 using a suitable deposition process, such as, e.g., chemical vapor deposition (CVD), atomic layer deposition (ALD), physical vapor deposition (PVD), among other deposition techniques.

The first set of conductive lines can then be patterned in the first line mask 106 corresponding to a pattern of the first set of conductive lines from a total set of conductive lines. The first line mask 106 is then patterned by any suitable patterning techniques, including but not limited to, lithography followed by etching. Other suitable techniques, such as sidewall image transfer (SIT), self-aligned double patterning (SADP), self-aligned multiple patterning (SAMP), self-aligned quadruple patterning (SAQP) can be used.

The first set of conductive lines can be a first or one or more sets of conductive lines to ultimately be formed in the dielectric layer 104. As such, the first line mask 106 is patterned with a first set of openings 110 corresponding to each of the conductive lines of the first set of conductive lines, such as, e.g., a set including every other conductive line of the total set of conductive lines. In an exemplary embodiment, the first line mask 106 is formed by sidewall image transfer (SIT) process, which involving forming a mandrel, depositing spacers on mandrel sidewalls, removing mandrel, and using the spacers as the mask layer to form the first line mask 106.

To facilitate smaller line pitch sizes, the first line mask 106 can be used to pattern the first set of conductive lines. As a result, more tolerance for line-width precision and etching precision can be used because the risks of removing the first line mask 106 and dielectric layer 104 between conductive lines is reduced. Thus, a first line openings 110 are formed in the first line mask 106 using, e.g., lithography, including photolithography, among other suitable patterning techniques. Specifically, according to an embodiment of the present invention, the first line openings 110 are produced by applying a photoresist to the surface to be etched; exposing the photoresist to a pattern of radiation; and then developing the pattern into the photoresist utilizing a resist developer.

Figure 2:
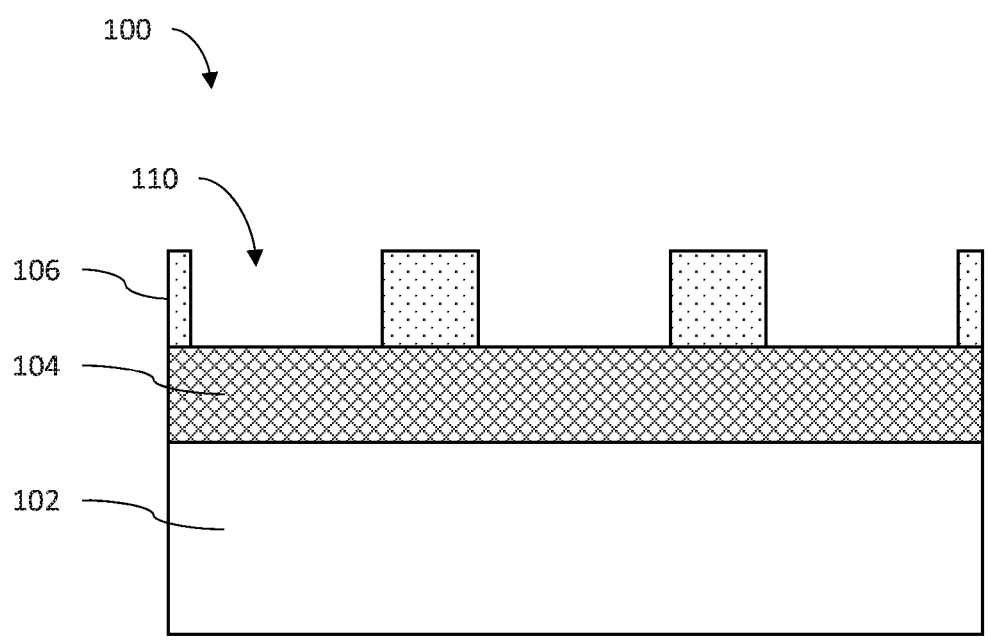
FIG. 2 is a cross-sectional view showing cross-section 2-2 from the semiconductor device with a patterned etch mask over a dielectric layer on a substrate of FIG. 1, in accordance with an embodiment of the present invention.

Referring now to FIG. 2, a cross-sectional view showing cross-section 2-2 from the semiconductor device with a patterned etch mask over a dielectric layer on a substrate of FIG. 1 is depicted according to an embodiment of the present invention.

As described with reference to FIG. 1 above, the first line openings 110 are patterned into the first line mask 106 over the dielectric layer 104. The first line openings 110 of the first line mask 106 have a relaxed pitch, as described above. In other words, the trench width of the first line openings 110 are larger than the targeted metal line width. As will be described below according to embodiments of the present invention, a relaxed trench pitch facilitates the use of sacrificial spacers.

Figure 3:
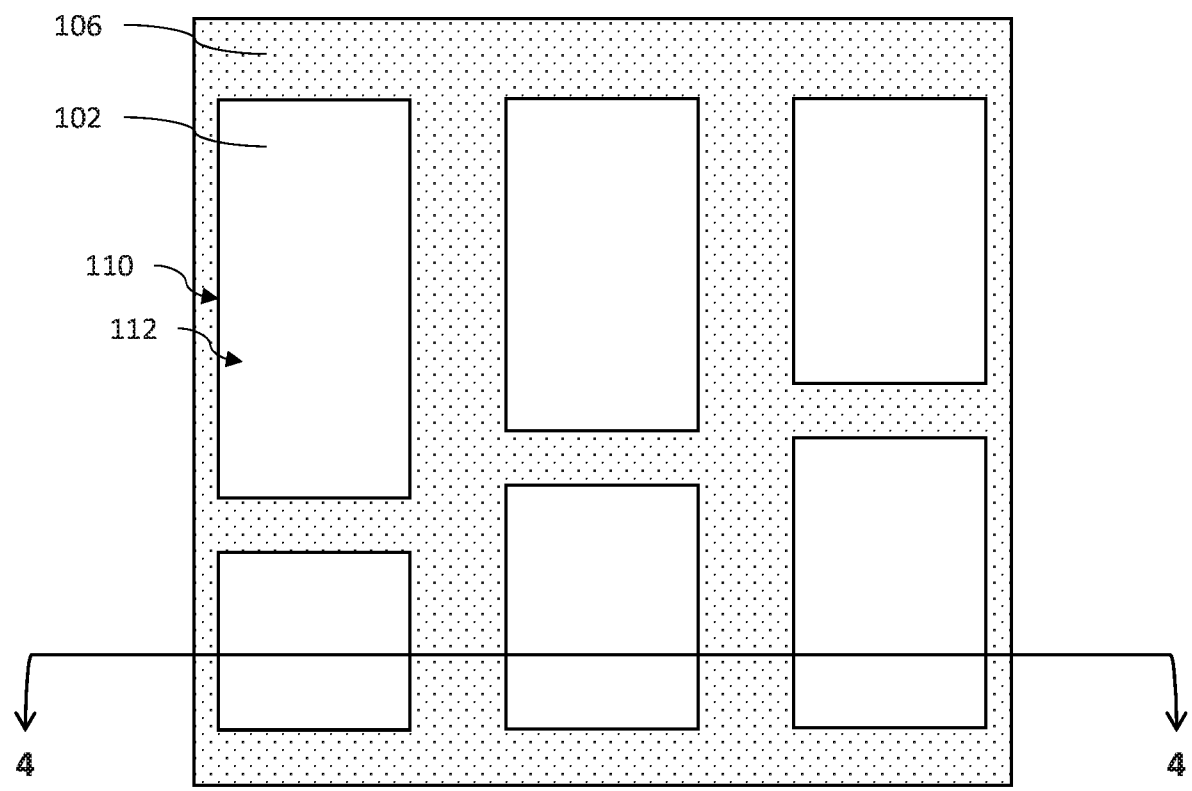
FIG. 3 is a top view showing a semiconductor device with openings patterned into a dielectric layer through an etch mask, in accordance with an embodiment of the present invention.

Referring now to FIG. 3, a top view showing a semiconductor device with openings patterned into a dielectric layer through an etch mask is depicted according to an embodiment of the present invention.

According to aspects of the present embodiment, a first line mask 106 is patterned with first line openings 110 according to a first set of conductive lines. Using the first line openings 110, first line trenches 112 can be formed through the dielectric layer 104 down to the substrate 102. According to one possible embodiment, the first line trenches 112 can be etched selective to the first line mask 106 using a suitable etch process. For example, the first line trenches 112 can be etched via, e.g., an anisotropic etch process such as reactive ion etching (RIE), among other suitable etch processes. Accordingly, the first line trenches 112 are etched down to the substrate 102 with a shape corresponding to the first line openings 110 in the first line mask 106. As a result, the first line openings 112 are similarly formed with a relaxed pitch relative to the target pitch of the first set of conductive lines.

Figure 4:
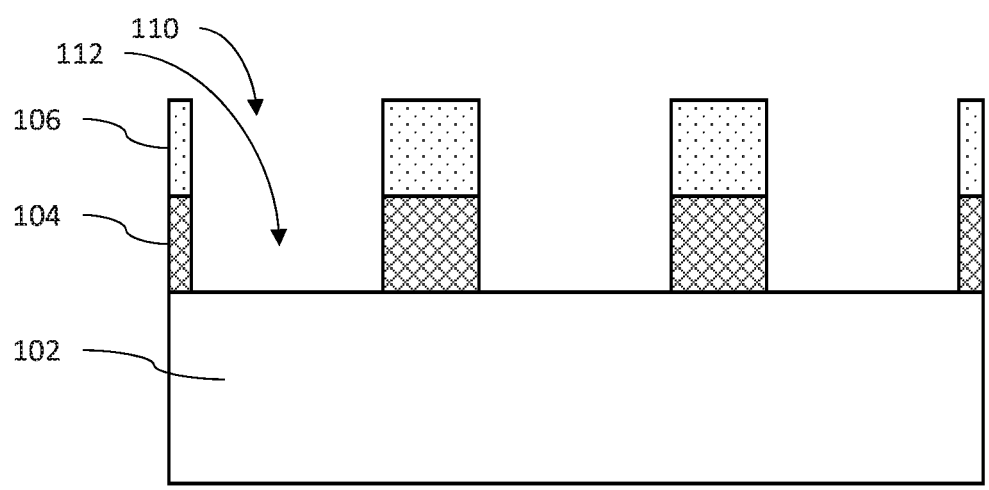
FIG. 4 is a cross-sectional view showing cross-section 4-4 from the semiconductor device with openings patterned into the dielectric layer through the etch mask of FIG. 3, in accordance with an embodiment of the present invention.

Referring now to FIG. 4, a cross-sectional view showing cross-section 4-4 from the semiconductor device with openings patterned into the dielectric layer through the etch mask of FIG. 3 is depicted according to an embodiment of the present invention.

As described above, the first line trenches 112 are etched down to the substrate 102 through the dielectric layer 104 using an anisotropic etch process selective to the first line mask 106. Thus, the sidewalls of the first line trenches 112 are substantially vertical relative to a horizontal substrate 102 and aligned with sidewalls of the first line openings 110. However, due to the etch process, the vertical sidewalls of the first line trenches 112 can have damage, including unintended sloping, width variability, and other manufacturing errors that can reduce performance and yields.

Figure 5:
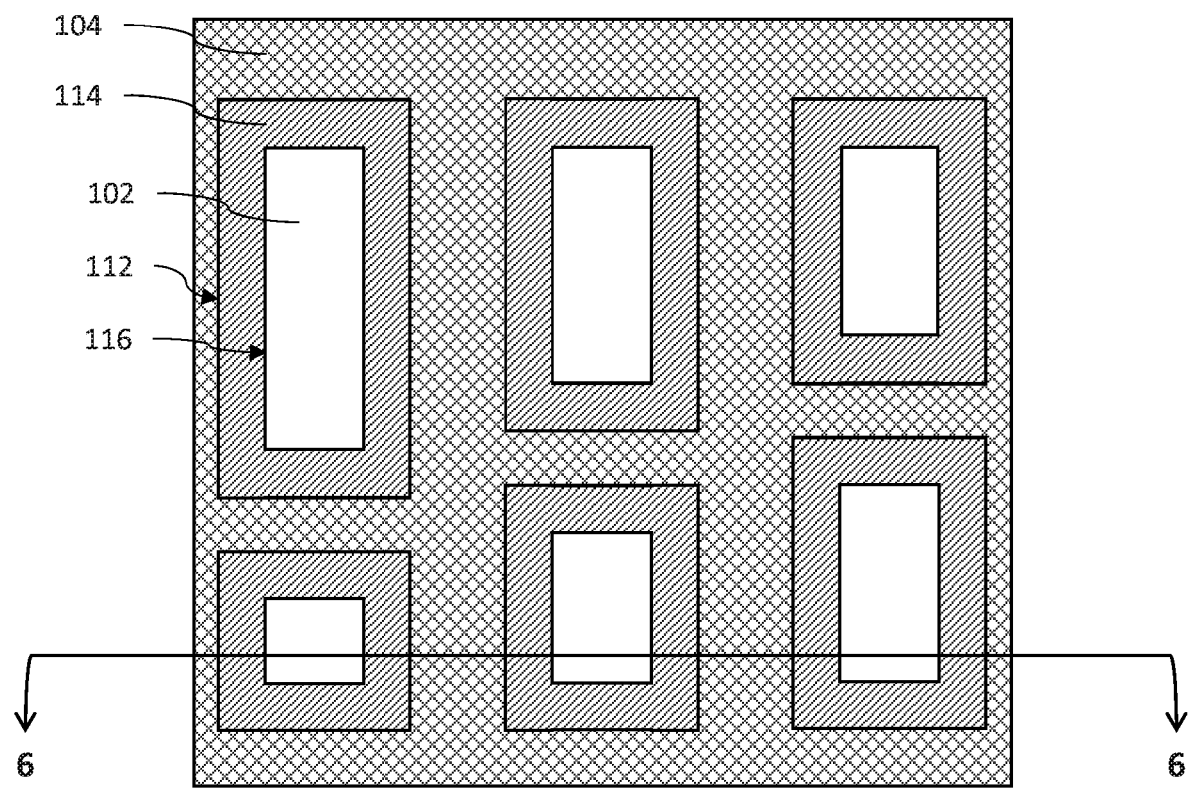
FIG. 5 is a top view showing a semiconductor device with sidewall spacers formed on sidewalls of openings in a dielectric layer, in accordance with an embodiment of the present invention.

Referring now to FIG. 5, a top view showing a semiconductor device with sidewall spacers formed on sidewalls of openings in a dielectric layer is depicted according to an embodiment of the present invention.

The first line mask 106 can be removed from the semiconductor device 100 to facilitate further processing of the device 100. Thus, the first line mask 106 can be removed via, e.g., wet etching or dry etching, or other process for removing the mask 106 selective to the dielectric layer 104 and the substrate 102.

According to an embodiment of the present invention, spacers 114 can be formed in each of the first line trenches 112. Because the first line trenches 112 are formed with a relaxed pitch relative to the target pitch of the conductive lines, the spacers 114 can be formed along the sidewalls of the first line trenches 112 to restrict the trenches 112 to have dimensions corresponding to the desired conductive line dimensions. As a result, the conductive line trenches 116 are formed.

The spacers 114 can be formed using, e.g., a series of processing steps including, e.g., conformal deposition of a material followed by anisotropic etching of the deposited material selective to the dielectric layer 104 and the substrate 102 to remove horizontal portions of the deposited material. As a result, vertical sidewall spacers 114 remain lining the sidewalls of the first line trenches 112, facilitating a vertical trench sidewall and even and uniform trench width and length. According to one possible embodiment of the present invention, the spacers 114 can include, e.g., a sacrificial semiconductor material, such as, e.g., amorphous silicon (Si), silicon germanium (SiGe), or other suitable sacrificial semiconductor material.

Figure 6:
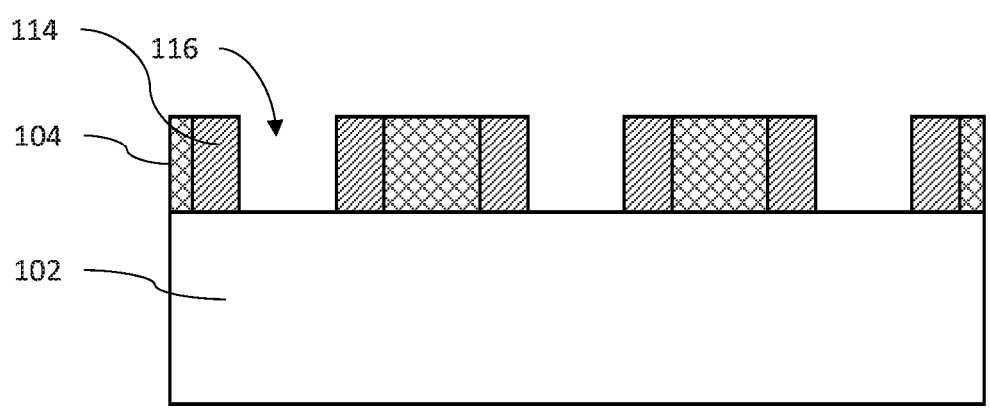
FIG. 6 is a cross-sectional view showing cross-section 6-6 from the semiconductor device with the sidewall spacers formed on the sidewalls of the openings in the dielectric layer of FIG. 5, in accordance with an embodiment of the present invention.

Referring now to FIG. 6, a cross-sectional view showing cross-section 6-6 from the semiconductor device with the sidewall spacers formed on the sidewalls of the openings in the dielectric layer of FIG. 5 is depicted according to an embodiment of the present invention.

Upon forming spacers 114 in the first line trenches 112 of the dielectric layer 104, conductive line trenches 116 are formed over the substrate 102. The conductive line trenches 116 have substantially vertical sidewalls formed by the spacers 114 relative to the horizontal top surface of the substrate 102. The spacers 114 can include a width that represents a minimum isolation width between conductive lines. By forming the spacers 114 at such a width, the spacers 114 can include a material to which the dielectric layer 104 can be selectively etched. As a result, in subsequent processing, etching of the dielectric layer 104 to form additional conductive trenches can be prevent from over-etching that would otherwise risk dielectric breakdown between conductive lines.

Figure 7:
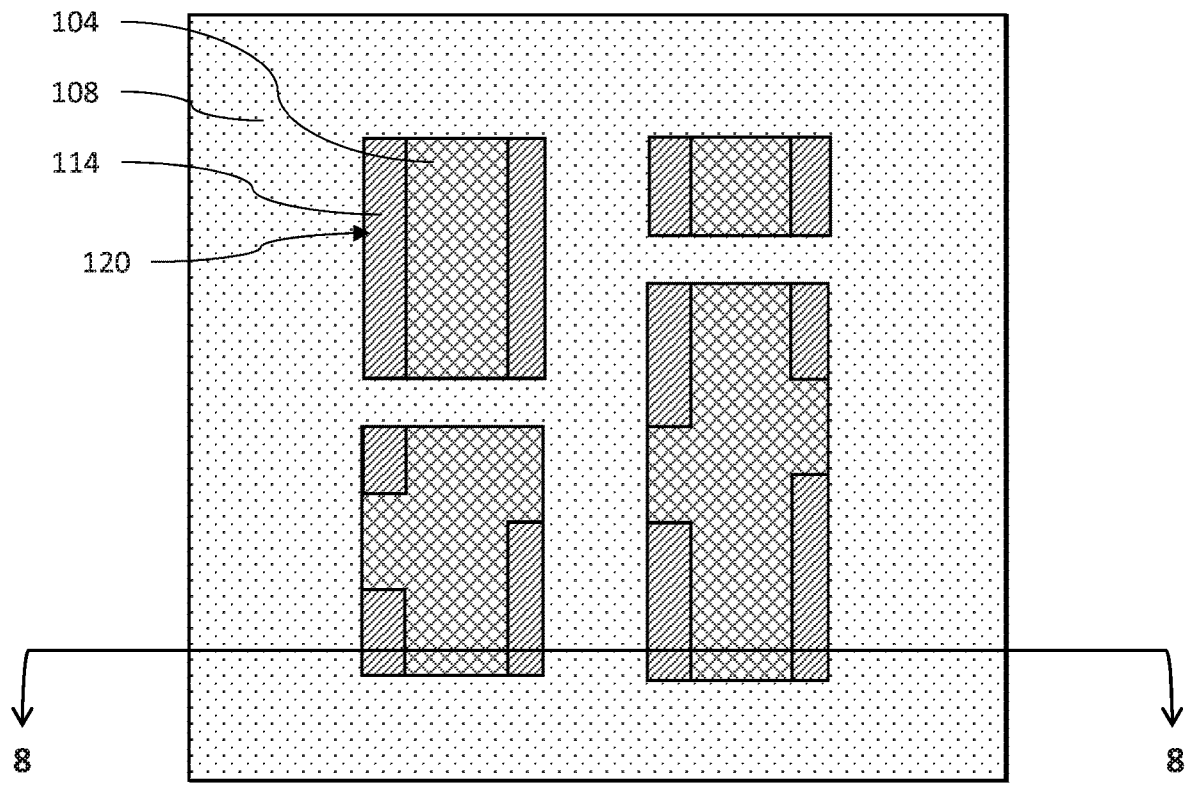
FIG. 7 is a top view showing a semiconductor device with a second etch mask patterned over a dielectric layer including sidewall spacers around openings, in accordance with an embodiment of the present invention.

Referring now to FIG. 7, a top view showing a semiconductor device with a second etch mask patterned over a dielectric layer including sidewall spacers around openings is depicted according to an embodiment of the present invention.

According to an aspect of the present invention, to facilitate small conductive line pitch, the conductive lines are patterned in multiple separate sets. A second set of line openings 120 can be formed that corresponds to a second set of conductive lines of a total set of conductive lines. According to one possible embodiment, the first conductive lines described above and the second conductive lines are alternating conductive lines. Thus, the second line openings 120 are patterned into a second line mask 108 over areas in the dielectric layer 104 that are between the first lines trenches 112. As a result, the second line openings 120 are formed over the dielectric layer 104 corresponding to a pattern for the second set of conductive lines.

Similar to the first line mask 106 described above, the second line mask 108 can be, e.g., deposited via a suitable deposition process and patterned using, e.g., photolithography or other patterning process. As such, the second line mask 108 can include a mask material that can be subjected to, e.g., photolithography, such as the materials described above with reference to FIG. 1.

The second line openings 120 can be formed with a relaxed pitch relative to a target pitch of the second set of conductive lines. The target pitch of the second set of conductive lines can be equal to or different from the target pitch of the first set of conductive lines. However, because the pitch of the second line openings 120 is relaxed, the spacers 114 may be exposed by the second line openings 120. As described above, the spacers 114 and the dielectric layer 104 can include materials that are selectively etchable relative to each other. Thus, even where the spacers 114 are exposed, over-etching can be prevented due to the spacers 114 when etching the dielectric layer 104 selective to the spacers 114, thus facilitating patterning at tighter target pitches.

Figure 8:
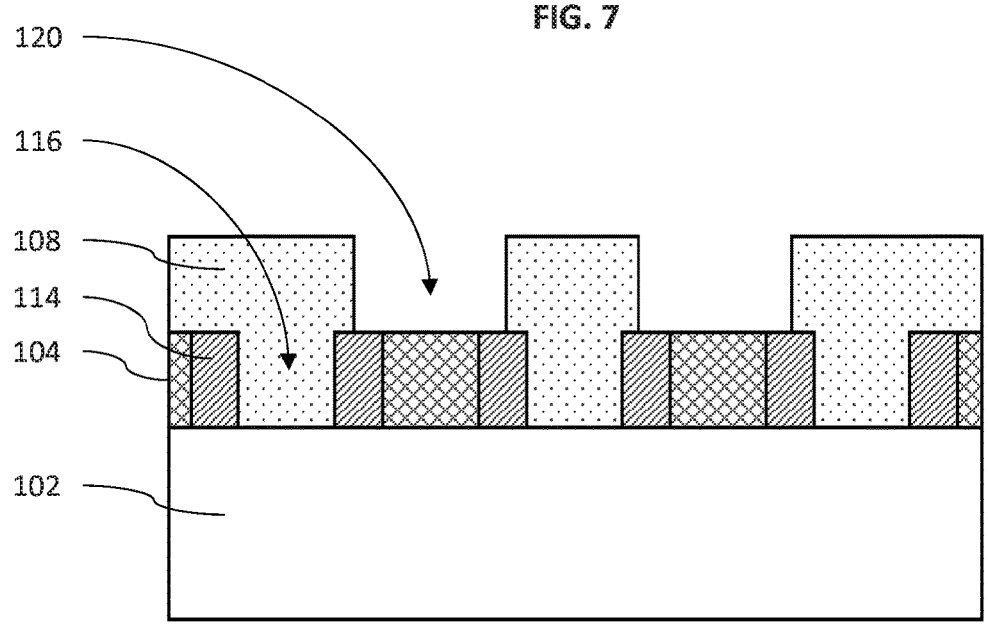
FIG. 8 is a cross-sectional view showing cross-section 8-8 from the semiconductor device with the second etch mask patterned over the dielectric layer of FIG. 7, in accordance with an embodiment of the present invention.

Referring now to FIG. 8, a cross-sectional view showing cross-section 8-8 from the semiconductor device with the second etch mask patterned over the dielectric layer of FIG. 7 is depicted according to an embodiment of the present invention.

The second line mask 108 is formed across the semiconductor device 100, filling and covering the conductive line trenches 116 and protecting the dielectric layer 104. The second line openings 120 are opened over the dielectric layer 104 on the substrate 102 corresponding to a target conductive line pattern for the second set of conductive lines. The second line openings 120 can have a relaxed pitch, and thus overlap with spacers 114. The overlap may be partial, exposing less than the whole width of the spacers 114. Thus, the over-etching and damage to adjacent conductive line trenches 116 can be prevented.

Figure 9:
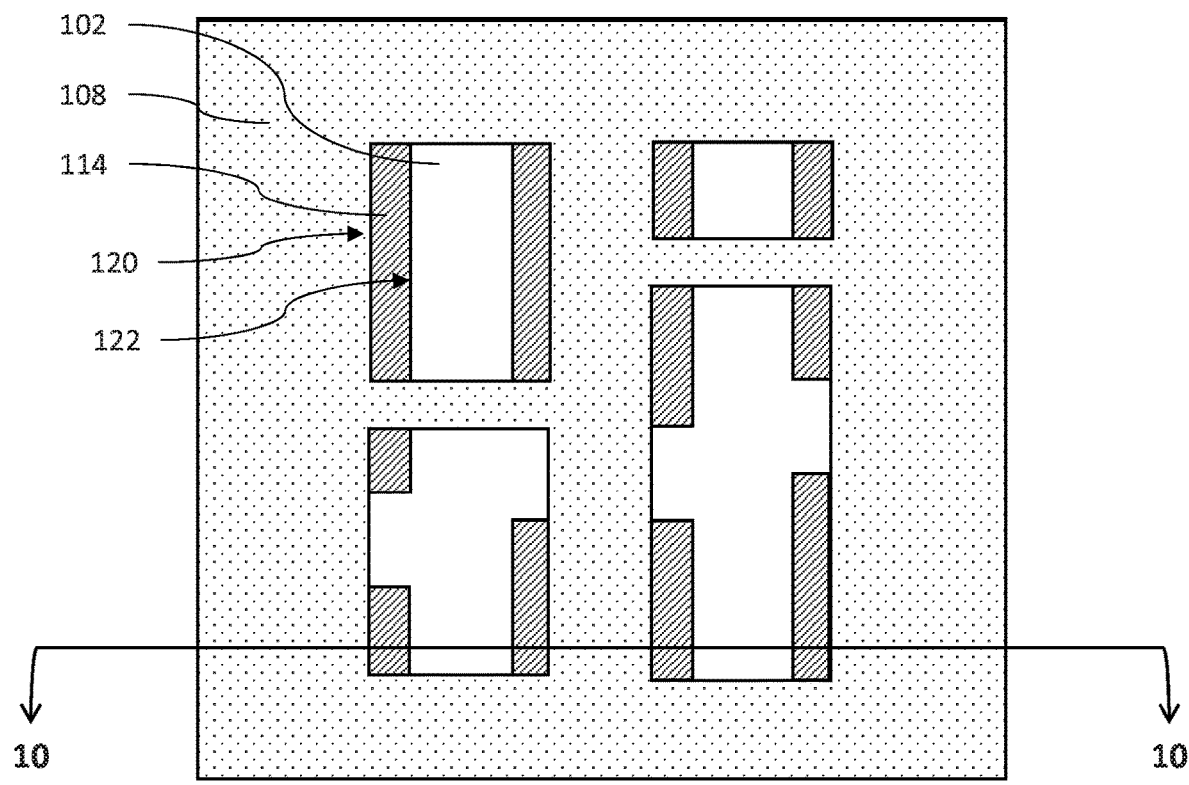
FIG. 9 is a top view showing a semiconductor device with second openings around sidewall spacers etched into a dielectric layer through a second etch mask, in accordance with an embodiment of the present invention.

Referring now to FIG. 9, a top view showing a semiconductor device with second openings around sidewall spacers etched into a dielectric layer through a second etch mask is depicted according to an embodiment of the present invention.

The dielectric layer 104 can be patterned according to the second line openings 120 to form second line trenches 122. Similar to the first line trenches 112 described above, the second line trenches 122 can be, e.g., etched through the dielectric layer 104 down to the substrate 102 selective to the second line mask 108. The second line trenches 122 can be etched via, e.g., an anisotropic etch process, such as RIE, to etch down to the substrate 102. Because the spacers 114 include a material that is selective relative to the dielectric layer 104, the etch process leaves the spacers 114 intact. Thus, isolation width is protected between adjacent trenches.

Figure 10:
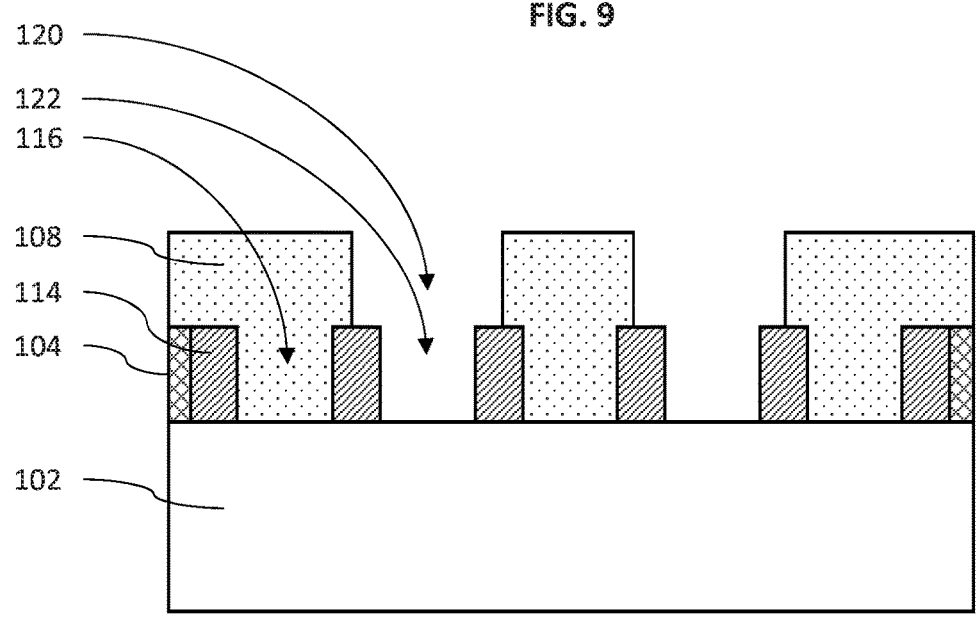
FIG. 10 is a cross-sectional view showing cross-section 10-10 from the semiconductor device with the second openings around the sidewall spacers etched into the dielectric layer through the second etch mask of FIG. 9, in accordance with an embodiment of the present invention.
Figure 11:
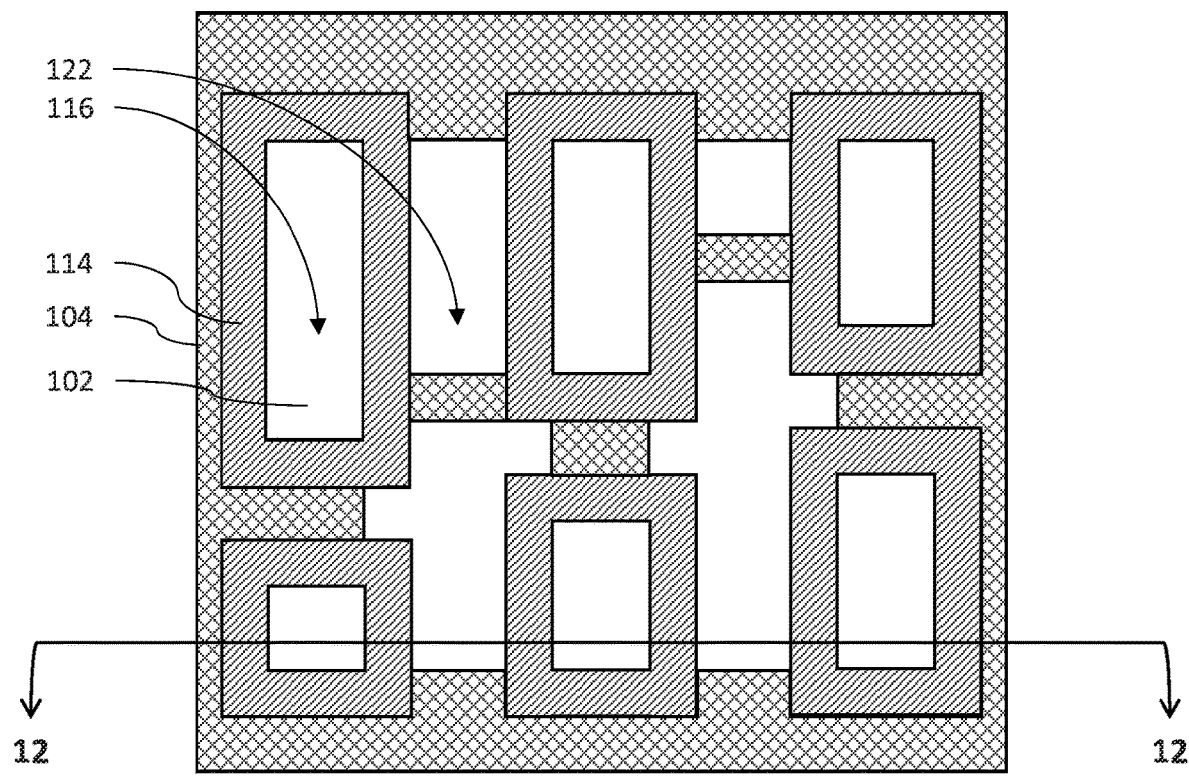
FIG. 11 is a top view showing a semiconductor device with first and second sets of openings formed in a dielectric layer around sidewall spacers, in accordance with an embodiment of the present invention.

Referring now to FIG. 10, a cross-sectional view showing cross-section 10-10 from the semiconductor device with the second openings around the sidewall spacers etched into the dielectric layer through the second etch mask of FIG. 11 is depicted according to an embodiment of the present invention.

As described above, the second line trenches 122 are etched into the dielectric layer 104 down to the substrate 102 by etching selective to the second line mask 108 and the spacers 114. Thus, the second line trenches 122 and the conductive line trenches 116 are separated at least by the spacers 114, ensuring a minimum isolation width to prevent dielectric breakdown. As a result, the second line trenches 122 can form a second set of the conductive line trenches 122.

Referring now to FIG. 11, a top view showing a semiconductor device with first and second sets of openings formed in a dielectric layer around sidewall spacers is depicted according to an embodiment of the present invention.

The second line mask 108 can be removed from the semiconductor device 100 to open up the conductive line trenches 116 and 122 for subsequent processing. According to an embodiment of the present invention, the second line mask 108 is removed by, e.g., etching the second line mask 108 selective to the dielectric layer 104, the substrate and spacers 114. To etch the second line mask 108, an, e.g., anisotropic etch process can be used, such as, e.g., RIE. However, an isotropic etch process may alternatively be used to recess the second line mask 108 down to the substrate 102 and out to the spacers 114 and sidewalls of the dielectric layer 104.

Figure 12:
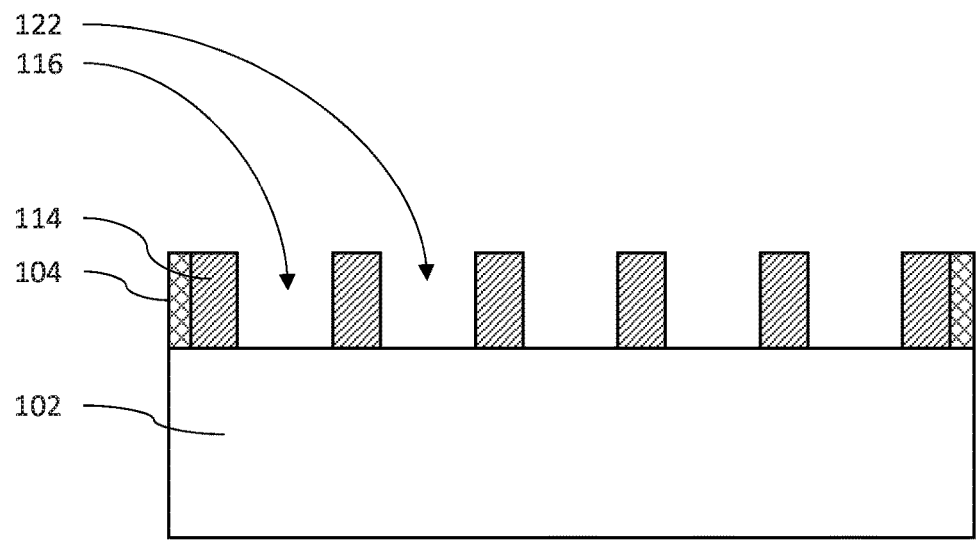
FIG. 12 is a cross-sectional view showing cross-section 12-12 from the semiconductor device with the first and second sets of openings formed in the dielectric layer around the sidewall spacers of FIG. 11, in accordance with an embodiment of the present invention.

Referring now to FIG. 12, a cross-sectional view showing cross-section 12-12 from the semiconductor device with the first and second sets of openings formed in the dielectric layer around the sidewall spacers of FIG. 11 is depicted according to an embodiment of the present invention.

The second line mask 108 is completely removed from over the dielectric layer 104 and from within the conductive line trenches 116. Thus, the conductive line trenches 116 and the second line trenches 122 are opened in the dielectric layer 104 down to the substrate 102, and separated by at least the spacers 114.

According to an embodiment of the present invention, the spacers 114 have been formed with a minimum width corresponding to an isolation with width for the target pitch of the conductive line trenches 116 and 122. Thus, the conductive line trenches 116 and 122 have at least the minimum width of the spacers 114, but may have more where the second line openings 120 of the second line mask 108 do not overlap with the spacers 114. As a result, dielectric breakdown between conductive lines can be prevented.

Figure 13:
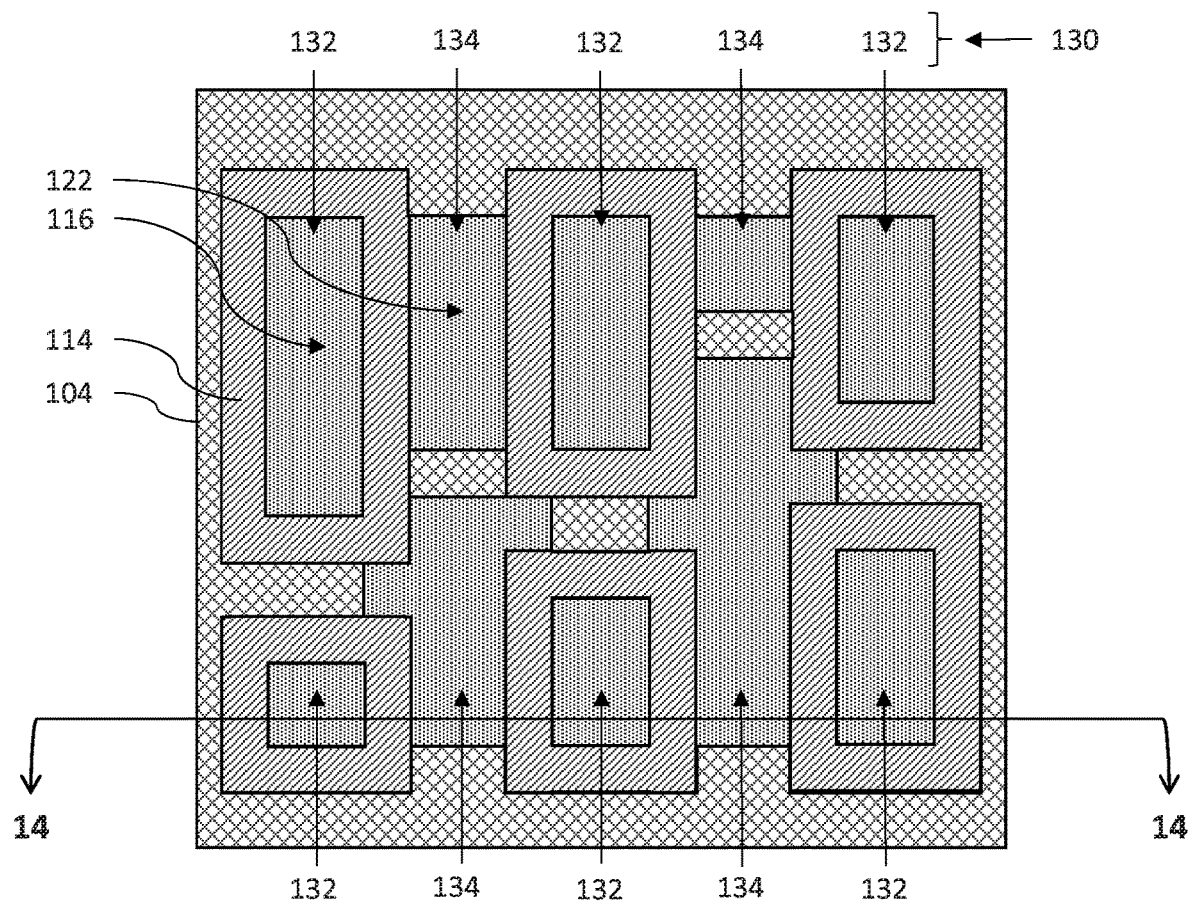
FIG. 13 is a top view showing a semiconductor device having first and second sets of metal lines formed in first and second sets of openings in a dielectric layer around sidewall spacers, in accordance with an embodiment of the present invention.

Referring now to FIG. 13, a top view showing a semiconductor device having first and second sets of metal lines formed in first and second sets of openings in a dielectric layer around sidewall spacers is depicted according to an embodiment of the present invention.

According to an embodiment of the present invention, conductive lines 130 can be formed in the conductive line openings 116 and 122. The conductive lines 130 form a BEOL interconnect layer. Thus, the conductive lines 130 carry an electrical current. As a result, the conductive lines 130 are formed from a conductive material, such as, e.g., a metal or metal alloy, a conductive oxide, a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition. According to an embodiment of the present invention, the conductive lines 130 are formed from a metal, such as, e.g., tungsten (W), titanium (Ti), tantalum (Ta), ruthenium (Ru), zirconium (Zr), cobalt (Co), copper (Cu), aluminum (Al), lead (Pb), platinum (Pt), tin (Sn), silver (Ag), gold (Au) or other metals and alloys thereof.

The conductive lines 130 can include the total set of conductive lines, including the first set of conductive lines 132 and the second set of conductive lines 134. The first set of conductive lines 132 are formed in the conductive line trenches 116 by filling the conductive line trenches 116 with conductive material. The conductive line trenches 116 can be filled by, e.g., depositing the conductive material in the conductive line trenches 116 using, e.g., a suitable deposition technique including those described above, such as, e.g., CVD.

Similarly, the second set of conductive lines 134 can be deposited in the second line trenches 122 using, e.g., CVD. The first set of conductive lines 132 and the second set of conductive lines 134 can be deposited concurrently. After each deposition, excess material can be planarized and/or recessed from the semiconductor device with a suitable etch or planarization process. Additionally, the first set of conductive lines 132 and the second set of conductive lines 134 can include the same material or different material.

Figure 14:
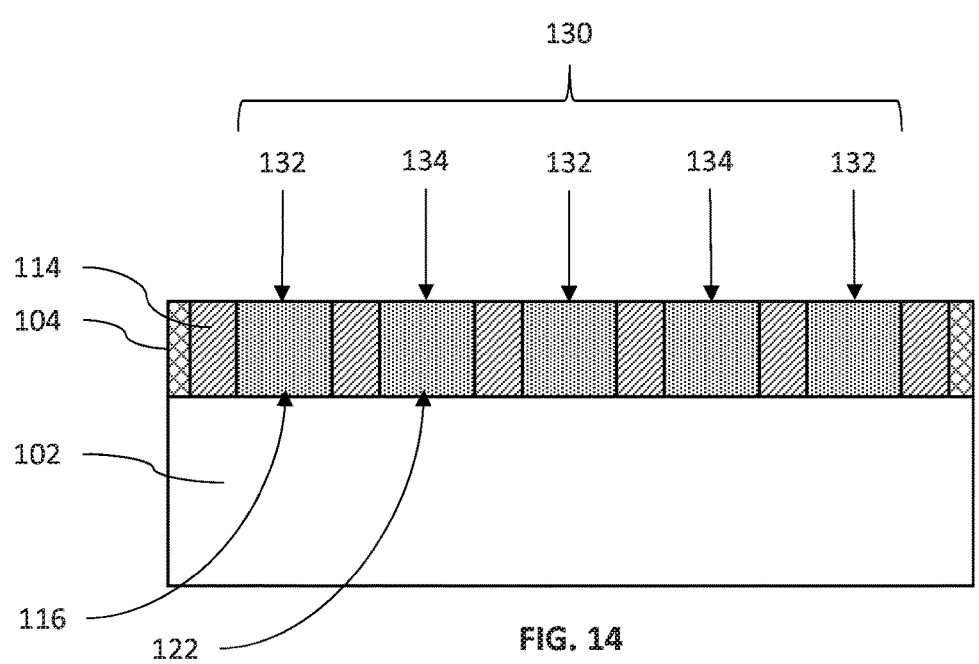
FIG. 14 is a cross-sectional view showing cross-section 14-14 from the semiconductor device having the first and second sets of metal lines formed in the first and second sets of openings in the dielectric layer around sidewall spacers of FIG. 13, in accordance with an embodiment of the present invention.

Referring now to FIG. 14, a cross-sectional view showing cross-section 14-14 from the semiconductor device having the first and second sets of metal lines formed in the first and second sets of openings in the dielectric layer around sidewall spacers of FIG. 13 is depicted according to an embodiment of the present invention.

As described above, the trenches 116 and 122 are filled with conductive material to form conductive lines 130 separated at least by spacers 114. The conductive material of the conductive lines 130 can fill the trenches 116 and 122 to a level that is coplanar with top surfaces of the spacers 114 and dielectric layer 104, the top surface being a surface of the spacers 114 and dielectric layer 104 opposite to the substrate 102.

Figure 15:
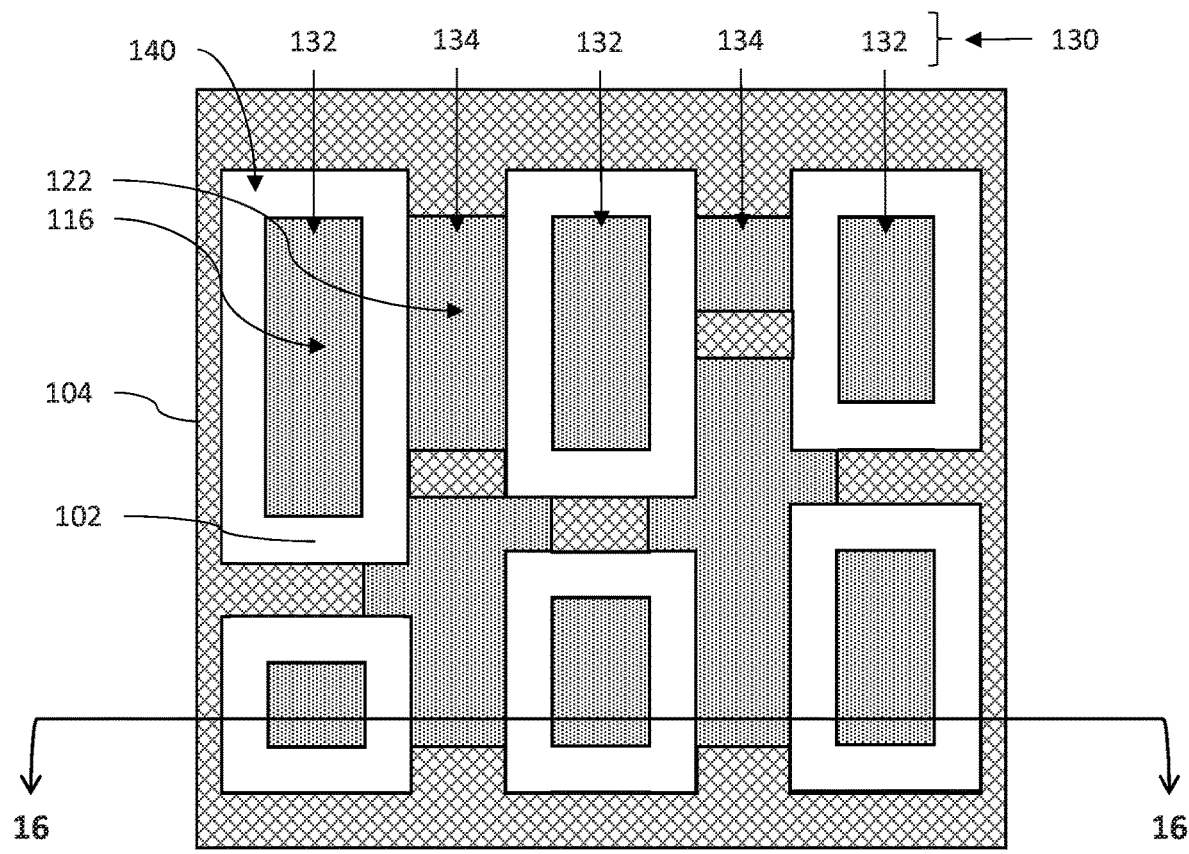
FIG. 15 is a top view showing a semiconductor device having first and second sets of metal lines formed in first and second sets of openings in a dielectric layer with sidewall spacers in the dielectric layer removed, in accordance with an embodiment of the present invention.

Referring now to FIG. 15, a top view showing a semiconductor device having first and second sets of metal lines formed in first and second sets of openings in a dielectric layer with sidewall spacers in the dielectric layer removed is depicted according to an embodiment of the present invention.

According to an embodiment of the present invention, the spacers 114 of the semiconductor device 100 can be removed to form isolation regions 140 around the conductive lines 130. The spacers 114 can be removed using a selective etch process, such as, e.g., wet etch, RIE or other suitable etch process, selective to the conductive lines 130 and the dielectric layer 104. As a result of the etching, the spacers 114 are recessed down to the substrate 102, removing the spacer 114 material from around the conductive lines 130.

Figure 16:
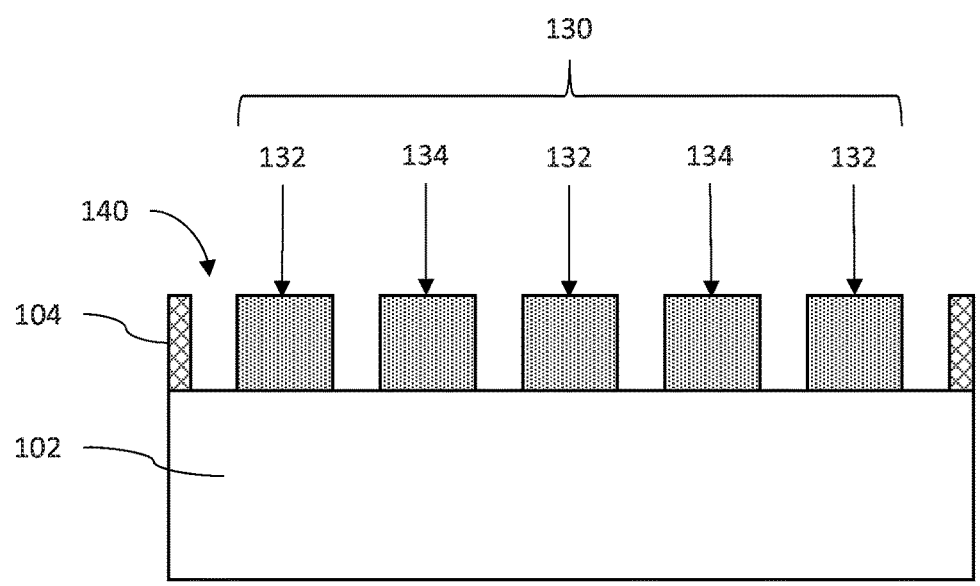
FIG. 16 is a cross-sectional view showing cross-section 16-16 from the semiconductor device having the first and second sets of metal lines formed in the first and second sets of openings in the dielectric layer with sidewall spacers in the dielectric layer removed of FIG. 15, in accordance with an embodiment of the present invention.

Referring now to FIG. 16, a cross-sectional view showing cross-section 16-16 from the semiconductor device having the first and second sets of metal lines formed in the first and second sets of openings in the dielectric layer with sidewall spacers in the dielectric layer removed of FIG. 15 is depicted according to an embodiment of the present invention.

Removing the spacers 114 leaves behind the conductive lines 130 and the dielectric material of the dielectric layer 104 on the substrate 102. As a result, the conductive lines 130 are separated by the isolation regions 140 and any remaining dielectric material of the dielectric layer 104.

Figure 17:
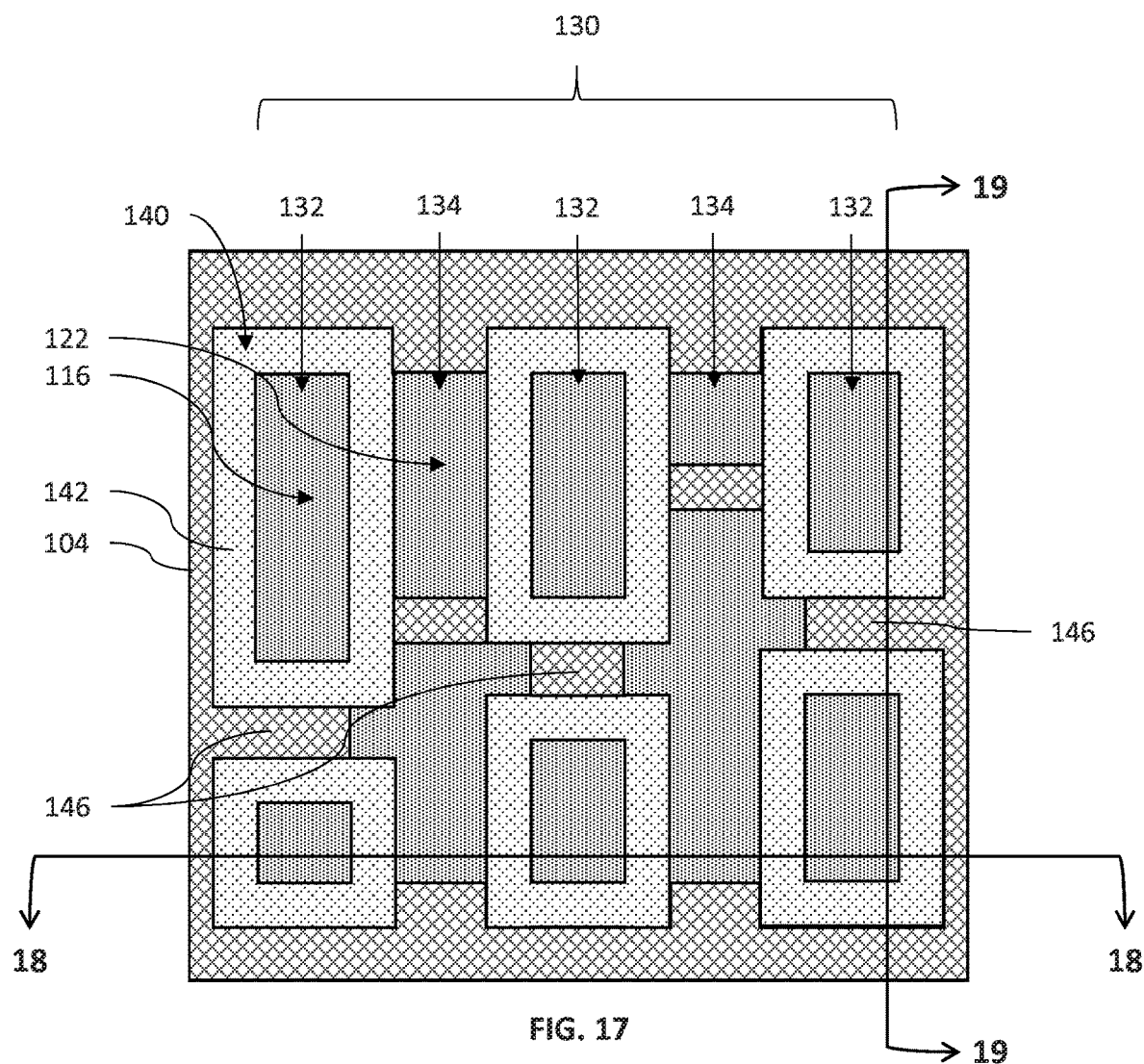
FIG. 17 is a top view showing a semiconductor device having first and second sets of metal lines formed in first and second sets of openings in a dielectric layer around a second dielectric, in accordance with an embodiment of the present invention.

Referring now to FIG. 17, a top view showing a semiconductor device having first and second sets of metal lines formed in first and second sets of openings in a dielectric layer around a second dielectric is depicted according to an embodiment of the present invention.

According to an embodiment of the present invention, the isolation regions 140 can be filled with replacement isolation material 142. The replacement isolation material 142 surrounds each of the conductive lines 130 by filling the isolation regions 140 between the conductive lines 130 and the dielectric material of the dielectric layer 104. In particular, according to one possible embodiment, the replacement isolation material 142 can be formed using, e.g., a deposition process including those described above. As a result, each of the conductive lines 130 are isolated from surround structures, such as other conductive lines 130, by at least the width of the replacement isolation material 142 on all sides of each of the conductive lines 130. Thus, isolation of each of the conductive lines 130 is ensured.

Moreover, because the replacement isolation material 142 is deposited in trenches 140 previously occupied by the spacers 114, the width and sidewalls of the replacement isolation material 142 is damage-free because it had not been subjected to each etch treatments, such as, e.g., plasma from an etch process. Thus, the replacement isolation material 142 is of a high quality, reducing the likelihood of dielectric breakdown and faults.

According to embodiments of the present invention, the replacement isolation material 142 includes, e.g., an ULK dielectric, such as the ULK dielectric materials described above. The replacement isolation material 142 can include, e.g., a material that is the same or different as the material of the dielectric layer 104. Thus, a replacement layer of ULK dielectric material is formed as the replacement isolation material 142 between each of the conductive lines 130, ensuring high-quality dielectric between the conductive lines 130.

Figure 18:
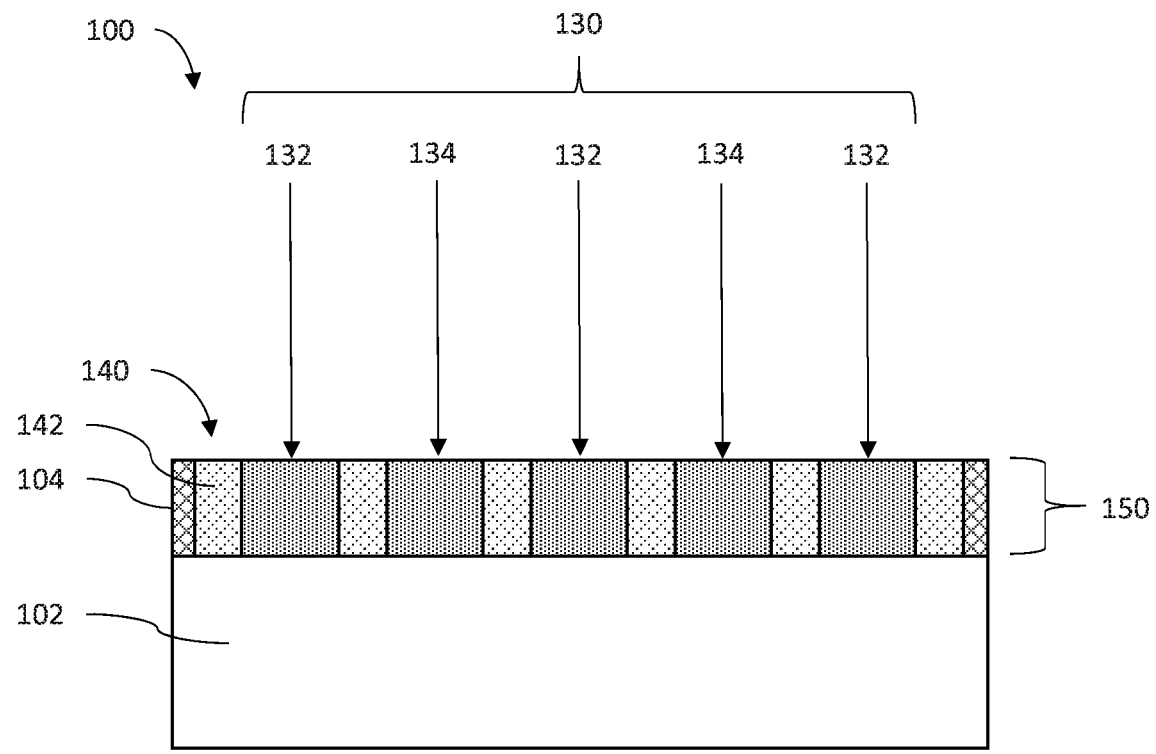
FIG. 18 is a cross-sectional view showing cross-section 18-18 from the semiconductor device having the first and second sets of metal lines formed in the first and second sets of openings in the dielectric layer around the second dielectric of FIG. 17, in accordance with an embodiment of the present invention.

Referring now to FIG. 18, a cross-sectional view showing cross-section 18-18 from the semiconductor device having the first and second sets of metal lines formed in the first and second sets of openings in the dielectric layer around the second dielectric of FIG. 17 is depicted according to an embodiment of the present invention.

The replacement isolation material 142 is deposited in the trenches 116 and 122, as described above, to form an interconnect layer 150. The interconnect layer 150 serves as a BEOL layer that provides connections between devices formed in or on the substrate 102. Upon depositing the replacement isolation material 142, the semiconductor device 100 can be planarized using, e.g., CMP, to remove any replacement isolation material 142 extending beyond the top surface of the dielectric layer 104. Accordingly, each of the conductive lines 130, the dielectric layer 104 and the replacement isolation material 142 have coplanar top surfaces opposite to the substrate 102.

Figure 19:
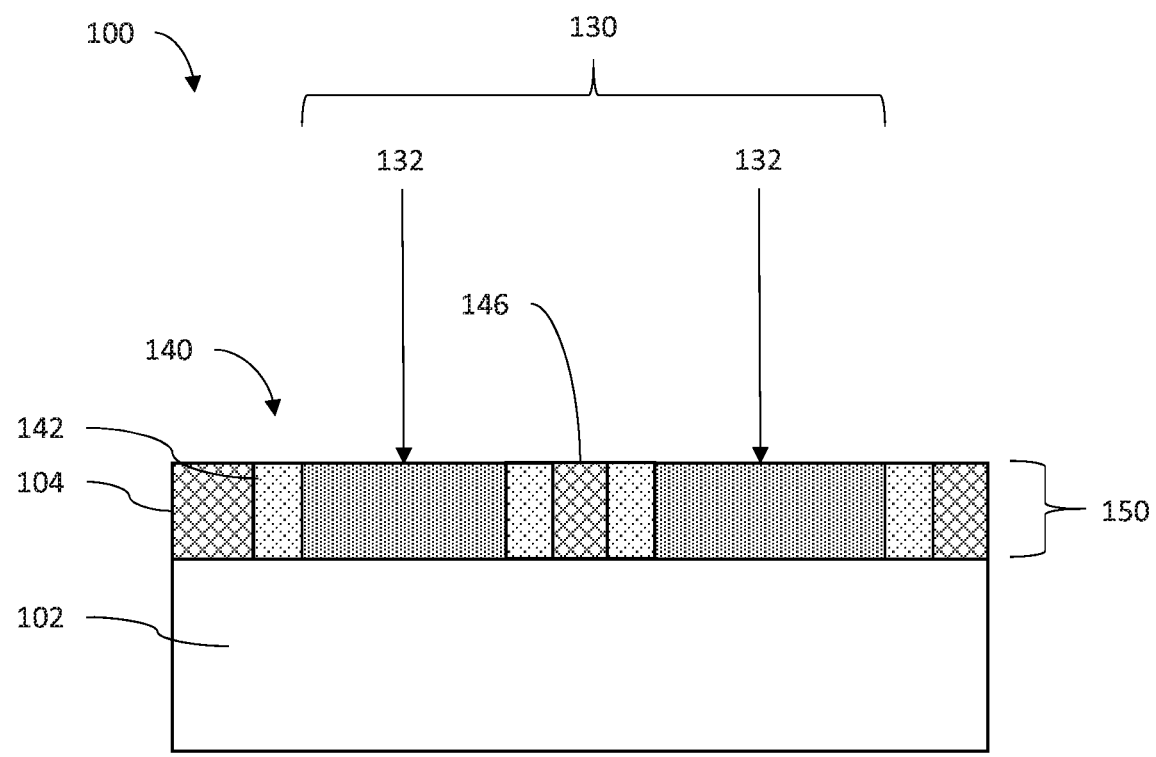
FIG. 19 is a cross-sectional view showing cross-section 19-19 from the semiconductor device having the first and second sets of metal lines formed in the first and second sets of openings in the dielectric layer around the second dielectric of FIG. 17, in accordance with an embodiment of the present invention.

Referring now to FIG. 19, a cross-sectional view showing cross-section 19-19 from the semiconductor device having the first and second sets of metal lines formed in the first and second sets of openings in the dielectric layer around the second dielectric of FIG. 17 is depicted according to an embodiment of the present invention.

According to an embodiment of the present invention, the conductive lines 130 in a direction across the semiconductor device 100 can have a relaxed pitch. For example, the conductive lines 130 can be rectangularly shaped with a length that is larger than a width. The pitch of the conductive lines 130 in the direction of the length may be relaxed compared to a pitch in the direction of the width. As a result, the spacers 114 may not space across a distance between length-wise ends of conductive lines 130. Accordingly, material of the dielectric layer 104 remains between the replacement isolation material 142 that replaces the spacers 114 between conductive lines. As a result, in a length-wise direction of the conductive lines 130, two regions of replacement isolation material 142 sandwich a sandwiched dielectric 146 between ends of the conductive lines 130.

Figure 20:
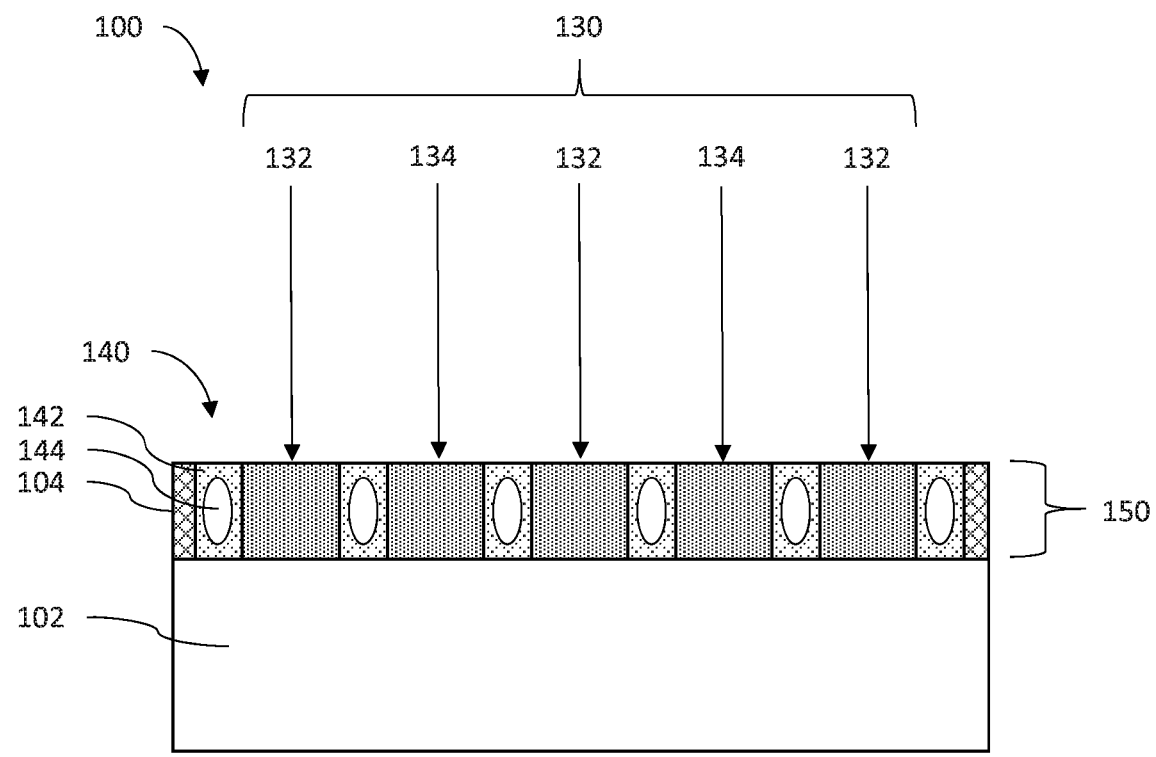
FIG. 20 is a cross-sectional view showing cross-section 18-18 from the semiconductor device having the first and second sets of openings in the dielectric layer filled with the second dielectric including an air gap in each opening of FIG. 17, in accordance with an embodiment of the present invention.

Referring now to FIG. 20, a cross-sectional view showing cross-section 18-18 from the semiconductor device having the first and second sets of openings in the dielectric layer filled with the second dielectric including an air gap in each opening of FIG. 17 is depicted according to an embodiment of the present invention.

According to embodiments of the present invention, the replacement isolation material 142 can include an air gap 144 in between each conductive line 130 in the interconnect layer 150. The replacement isolation material 142 can be, e.g., deposited with a suitable deposition process, into the trenches 140. Air has a very low dielectric constant (k). Thus, the air gaps 144 in the replacement isolation material 142 can improved isolation between the conductive lines 130. Therefore, the deposition of the replacement isolation material 142 can be performed with, e.g., a non-conformal process, that results in air gaps 144 forming in the centers of the isolation regions 140. The combination of improved uniformity of the isolation regions 140 due to the use of the sacrificial spacers 114 as well as the air gaps 144 can greatly improve the isolation between conductive lines 130, facilitating narrower conductive trenches and improved conductive line 130 pitch and/or conductive line 130 width. As a result, the conductive lines 130 of the interconnect layer 150 can accommodate smaller pitches of devices in or on the substrate 102, thus facilitating smaller device 100 size without compromising performance or yields.

Figure 21:
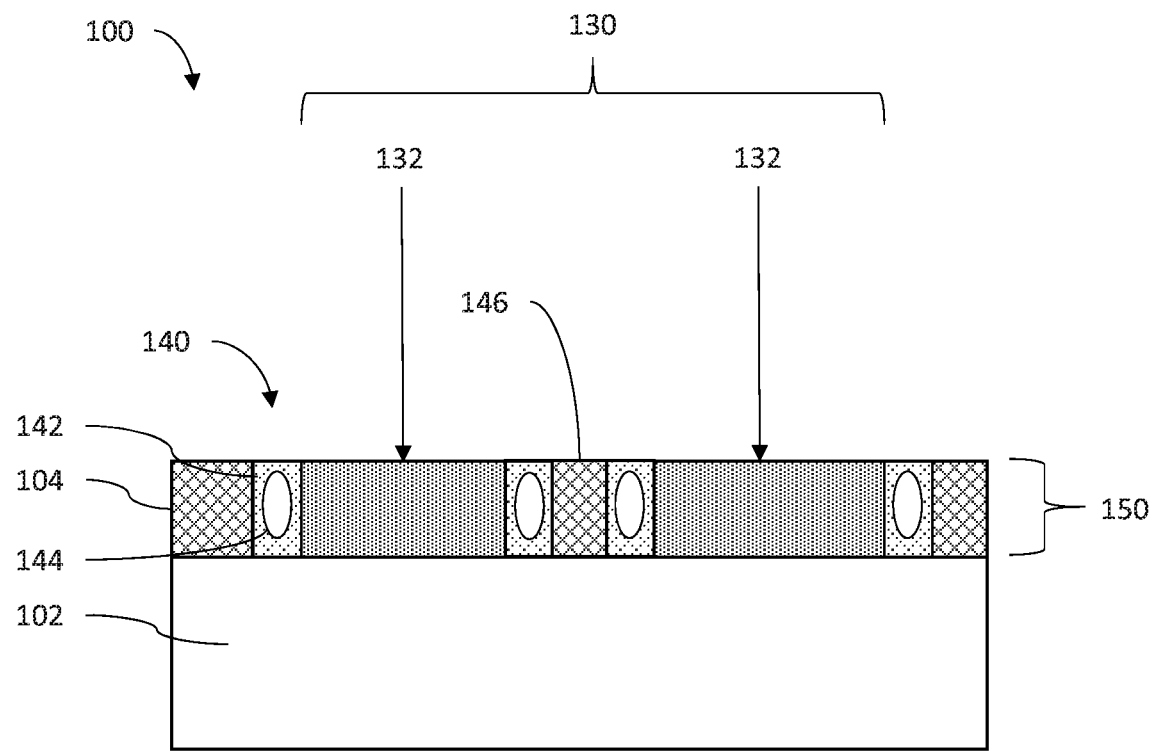
FIG. 21 is a cross-sectional view showing cross-section 19-19 from the semiconductor device having the first and second sets of metal lines formed in the first and second sets of openings in the dielectric layer around the second dielectric of FIG. 17, in accordance with an embodiment of the present invention.

Referring now to FIG. 21, a cross-sectional view showing cross-section 19-19 from the semiconductor device having the first and second sets of metal lines formed in the first and second sets of openings in the dielectric layer around the second dielectric of FIG. 17 is depicted according to an embodiment of the present invention.

According to an embodiment of the present invention, the conductive lines 130 in a direction across the semiconductor device 100 can have a relaxed pitch. For example, the conductive lines 130 can be rectangularly shaped with a length that is larger than a width. The pitch of the conductive lines 130 in the direction of the length may be relaxed compared to a pitch in the direction of the width. As a result, the spacers 114 may not space across a distance between length-wise ends of conductive lines 130. Accordingly, material of the dielectric layer 104 remains between the replacement isolation material 142 that replaces the spacers 114 between conductive lines. As a result, in a length-wise direction of the conductive lines 130, two regions of replacement isolation material 142 sandwich a sandwiched dielectric 146 between ends of the conductive lines 130. Because the replacement isolation material 142 is formed with air gaps 144, each of the replacement isolation material 142 portions sandwiching the sandwiched dielectric 146 have air gaps 144.

Figure 22:
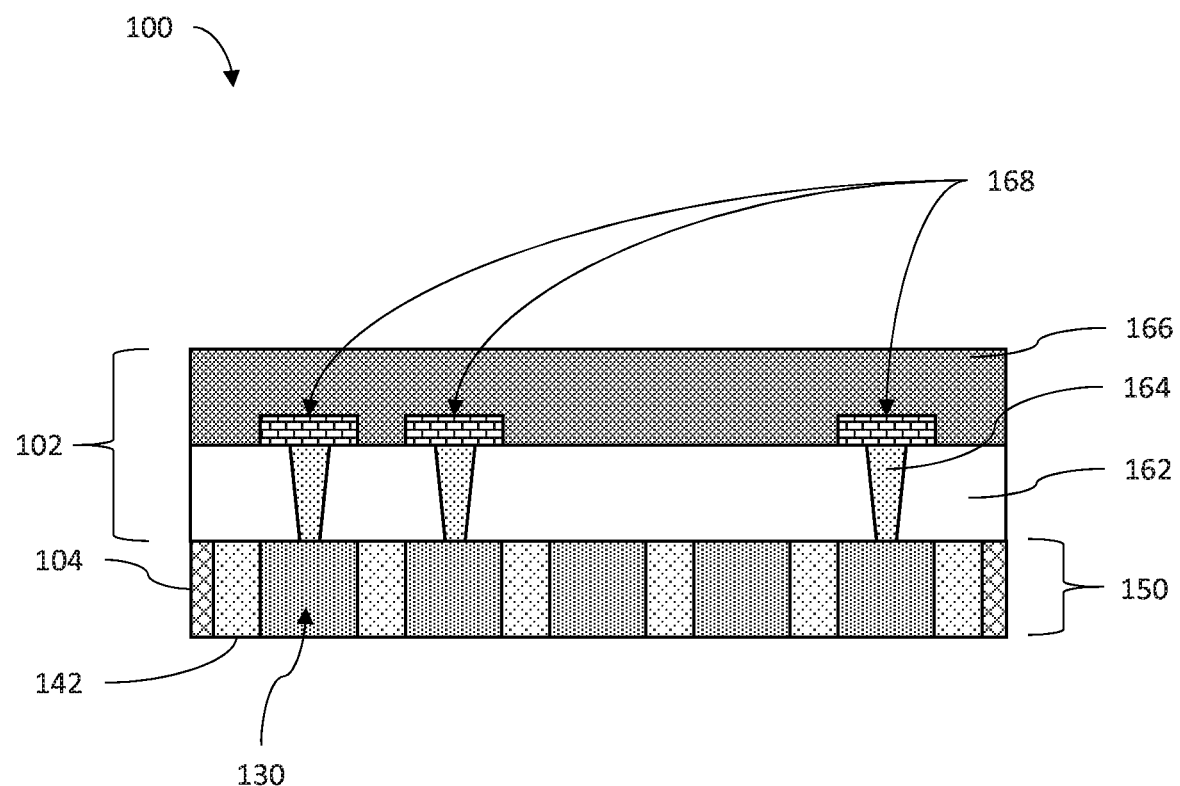
FIG. 22 is a cross-section view showing the semiconductor device with device structures formed within the substrate, in accordance with an embodiment of the present invention.

Referring now to FIG. 22, a cross-section view showing the semiconductor device with device structures formed within the substrate is depicted according to an embodiment of the present invention.

According to embodiments of the present invention, a semiconductor device 100, such as, e.g., the semiconductor device 100 described above, includes a BEOL interconnect 150 with conductive lines 130. The conductive lines 130 form interconnects between devices 168 in the substrate 102, such as, e.g., interconnects between transistors, contacts, and other devices.

Therefore, the substrate 102 can include a bulk substrate with a base substrate 162 and a device dielectric 166 formed on a side of the base substrate 162 opposite to the interconnect layer 150. Buried within the device dielectric 164 can be one or more devices 168 that interface with corresponding conductive lines 130 through vias 164 through the base substrate 162. Thus, the devices 168 can be connected to other devices 168 by the conductive lines 130 using the vias 164, thus forming the semiconductor device 100, such as, e.g., an integrated circuit device, including, e.g., central processing units, graphical processing units, multi-chip modules, memory devices, storage devices, among other devices and combinations thereof, with multiple device structures formed therein.

Because the replacement isolation material 142 is of high quality due, at least in part, to the use of the sacrificial spacers 114 as described above, the conductive lines 130 can have a large width and small pitch, thus decreasing resistance and increasing device 168 density, without sacrificing isolation reliability. As result, the semiconductor device 100 can be made more efficient and more reliable with higher device speeds.

Figure 23:
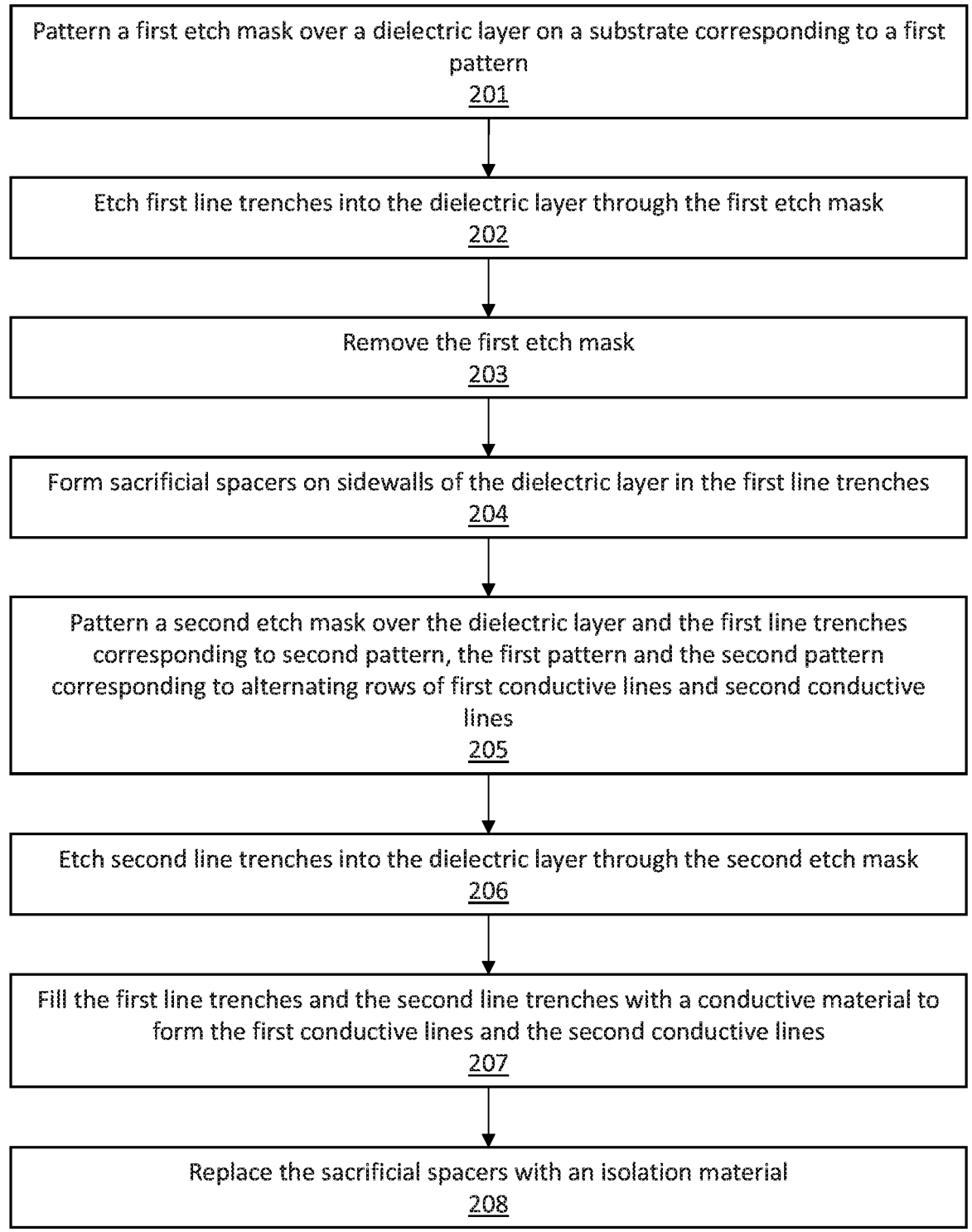
FIG. 23 is a block/flow diagram showing a system/method forming a semiconductor device with high quality ultra-low-k dielectric between conductive lines, in accordance with an embodiment of the present invention.

Referring now to FIG. 23, a block/flow diagram showing a system/method forming a semiconductor device with high quality ultra-low-k dielectric between conductive lines is depicted according to an embodiment of the present invention.

At block 201, a first etch mask is patterned over a dielectric layer on a substrate corresponding to a first pattern.

At block 202, first line trenches are etched into the dielectric layer through the first etch mask.

At block 203, the first etch mask is removed.

At block 204, sacrificial spacers are formed on sidewalls of the dielectric layer in the first line trenches.

At block 205, a second etch mask is patterned over the dielectric layer and the first line trenches corresponding to second pattern, the first pattern and the second pattern corresponding to alternating rows of first conductive lines and second conductive lines.

At block 206, second line trenches are etched into the dielectric layer through the second etch mask.

At block 207, the first line trenches and the second line trenches are filled with a conductive material to form the first conductive lines and the second conductive lines.

At block 208, the sacrificial spacers are replaced with an isolation material.

Having described preferred embodiments of a system and method for an interconnect with high quality ultra-low-k dielectric (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for forming a semiconductor device, the method comprising:
    forming first line trenches in a dielectric layer on a substrate;
    forming sacrificial spacers on sidewalls of the dielectric layer in the first line trenches;
    forming second line trenches in the dielectric layer, the first line trenches and the second line trenches including alternating rows of trenches separated by the sacrificial spacers;
    filling the first line trenches and the second line trenches with conductive material to form conductive lines; and
    replacing the sacrificial spacers with an isolation material.

2. The method as recited in claim 1, further including patterning a first etch mask over the dielectric layer for the first line trenches.

3. The method as recited in claim 1, further including patterning a second etch mask over the dielectric layer and the first line trenches for the second line trenches.

4. The method as recited in claim 1, wherein replacing the sacrificial spacers includes:
    removing the sacrificial spacers to open isolation regions between the first conductive lines and the second conductive lines; and
    filling the isolation regions with the isolation material.

5. The method as recited in claim 4, wherein the isolation includes an ultra-low-k dielectric.

6. The method as recited in claim 4, wherein depositing the isolation material includes forming an air gap within the isolation material in each of the isolation regions.

7. The method as recited in claim 1, wherein one or more of the rows of trenches include a plurality of trench segments separated by material of the dielectric layer.

8. The method as recited in claim 1, wherein the sacrificial spacers are replaced with the isolation material including a material different from a material of the dielectric layer.

9. The method as recited in claim 1, wherein forming the first line trenches includes performing anisotropic etching through an etch mask selective to the dielectric layer and the substrate.

10. A method for forming a semiconductor device, the method comprising:
    patterning a first etch mask over a dielectric layer on a substrate corresponding to a first pattern;
    etching first line trenches into the dielectric layer through the first etch mask;
    removing the first etch mask;
    forming sacrificial spacers on sidewalls of the dielectric layer in the first line trenches;
    patterning a second etch mask over the dielectric layer and the first line trenches corresponding to second pattern, the first pattern and the second pattern corresponding to alternating rows of first conductive lines and second conductive lines;
    etching second line trenches into the dielectric layer through the second etch mask;
    filling the first line trenches and the second line trenches with a conductive material to form the first conductive lines and the second conductive lines; and
    replacing the sacrificial spacers with an isolation material.

11. The method as recited in claim 10, wherein replacing the sacrificial spacers includes:
    removing the sacrificial spacers to open isolation regions between the first conductive lines and the second conductive lines; and
    filling the isolation regions with the isolation material.

12. The method as recited in claim 11, wherein the isolation includes an ultra-low-k dielectric.

13. The method as recited in claim 11, wherein depositing the isolation material includes forming an air gap within the isolation material in each of the isolation regions.

14. The method as recited in claim 10, wherein one or more of the alternating rows of conductive lines include a plurality of conductive line segments separated by material of the dielectric layer sandwiched between the isolation regions corresponding to each of the plurality of conductive line segments.

15. The method as recited in claim 10, wherein the sacrificial spacers are replaced with the isolation material including a material different from a material of the dielectric layer.

16. The method as recited in claim 10, wherein etching the first line trenches includes performing anisotropic etching through the first line mask selective to the dielectric layer and the substrate.

* * * * *